United States Patent
Lee et al.

(10) Patent No.: US 7,429,792 B2
(45) Date of Patent: Sep. 30, 2008

(54) STACK PACKAGE WITH VERTICALLY FORMED HEAT SINK

(75) Inventors: Ha Na Lee, Seoul (KR); Seung Taek Yang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 36 days.

(21) Appl. No.: 11/679,268

(22) Filed: Feb. 27, 2007

(65) Prior Publication Data

US 2008/0001283 A1    Jan. 3, 2008

(30) Foreign Application Priority Data

Jun. 29, 2006  (KR) .............. 10-2006-0059815
Dec. 21, 2006  (KR) .............. 10-2006-0132019

(51) Int. Cl.
*H01L 23/34* (2006.01)
(52) U.S. Cl. .................. 257/712; 257/718; 257/686
(58) Field of Classification Search .......... 257/686, 257/712, 718
See application file for complete search history.

(56) References Cited

U.S. PATENT DOCUMENTS 5,818,107 A  * 10/1998 Pierson et al. ............ 257/723
6,569,762 B2 * 5/2003  Kong ...................... 438/667
7,369,410 B2 * 5/2008  Chen et al. ............... 361/701

FOREIGN PATENT DOCUMENTS

KR    1999-52644    9/1999

* cited by examiner

*Primary Examiner*—Douglas M Menz
(74) *Attorney, Agent, or Firm*—Ladas & Parry LLP

(57) ABSTRACT

A stack package includes a base substrate having connection pads on an upper surface thereof and ball lands on a lower surface thereof; at least two semiconductor chps stacked by intervening a spacer on the base substrate and defined with through-holes for electrical connections on positions corresponding to the connection pads; electrical connection members for electrically connecting the stacked semiconductor chips and the base substrate to each other; a pair of heat sinks formed such that they contact the side surfaces of the stacked semiconductor chips and extend in a direction perpendicular to the base substrate; and outside connection terminals attached to the ball lands located on the lower surface of the base substrate.

12 Claims, 2 Drawing Sheets

STACK PACKAGE WITH VERTICALLY FORMED HEAT SINK

CROSS-REFERENCE TO RELATED APPLICATIONS

The present application claims priority to Korean patent application numbers 10-2006-0059815 filed on Jun. 29, 2006 and 10-2006-132019 filed on Dec. 21, 2006, which are incorporated herein by reference in their entirety.

BACKGROUND OF THE INVENTION

The present invention relates to a stack package, and more particularly to a stack package in which all stacked semiconductor chips equally discharge heat to the outside.

Semiconductor packaging technology continues to develop in response to the evolution of electronic appliances towards miniaturization and multi-functionality. For example, the increase in miniaturization has accelerated development of a chip scale package of a size approaching that of a chip. In addition, the increase in multi-functionality has accelerated the development of a stack package in which several chips capable of performing various functions are arranged in one package.

Semiconductor packages developed to adapt to the increasing miniaturization and multi-functionality of electronic appliances, when mounted to said appliances, often generate a substantial amount of heat that must be quickly discharged to the outside. If the heat generated in the semiconductor chips is not quickly discharged, the semiconductor chips' operational speed decreases. Further, an increase in internal temperature due to the generated heat causes serious damage to the semiconductor chips. As a result, a heat sink is often created on the upper surface of the semiconductor chip or semiconductor package in order to aid in the dissipation of the generated heat. However, formation of such a heat sink on the upper surface of a semiconductor package increases the overall thickness of the semiconductor package, thereby degrading the value of the end product.

Also, when a heat sink is formed on the upper surface of a stack package, only the heat generated in the uppermost semiconductor chip is quickly discharged. Heat dissipation efficiency gradually decreases from the uppermost semiconductor chip to the lowermost semiconductor chip; therefore, the heat generated in the remaining semiconductor chips cannot be discharged as quickly as the heat generated in uppermost semiconductor. Since nearly all of the heat generated in the lowermost semiconductor chip of a stack package is not discharged, the lowermost semiconductor chip is likely damaged or the overall performance of the semiconductor package is likely degraded.

SUMMARY OF THE INVENTION

An embodiment of the present invention is directed to a stack package in which the formation of heat sinks does not increase the overall thickness of the stack package, and in which the discharge of the heat generated in respective stacked semiconductor chips is equally discharged.

In an embodiment, a stack package comprises a base substrate having connection pads on an upper surface thereof and ball lands on a lower surface thereof; at least two semiconductor chips stacked by intervening on the base substrate and defined with through-holes for electrical connections on positions corresponding to the connection pads; electrical connection members for electrically connecting the stacked semiconductor chips and the base substrate to each other; a pair of heat sinks formed such that they contact the side surfaces of the stacked semiconductor chips and extend in a direction perpendicular to the base substrate; and outside connection terminals attached to the ball lands on the lower surface of the base substrate.

The connection pads are formed on the upper surface of the base substrate such that they are adjacent to both edges.

The spacer is smaller than the semiconductor chip.

The stack package further comprises heat conductive layers covering the surface of the semiconductor chips to be come into contact with the heat sinks. The heat conductive layer is deposited on the lower surface of each semiconductor chip.

Pad rerouting is implemented on the upper surface of each semiconductor chip such that wiring is formed on a surface of the through-hole or around the through-hole.

The electrical connection members are comprised of copper pins. The copper pins are inserted into the through-holes of the stacked semiconductor chips and connect to the connection pads of the base substrate, thereby electrically connecting the stacked semiconductor chips and the base substrate to each other.

Each heat sink is defined with insertion grooves, into which the semiconductor chips are respectively inserted, on the side surface thereof contacting the stacked semiconductor chips. Also, each heat sink is formed such that it has a plurality of branches on the surface opposite of the above-referenced side surface.

The outside connection terminals are comprised of solder balls.

DESCRIPTION OF SPECIFIC EMBODIMENTS

In the present invention, heat sinks discharge heat generated in the semiconductor chips stacked in a semiconductor package. The heat sinks extend in a direction perpendicular to the base substrate and contact the side surfaces of the stacked semiconductor chips. In this case, since the heat sinks extend in a direction perpendicular to the base substrate, they do not cause an increase in the thickness of the semiconductor package. Also, because the heat sinks are in contact with all of the stacked semiconductor chips without being limited to the semiconductor chip stacked uppermost, the same amount of heat is discharged from each semiconductor chip.

As a consequence, an embodiment of the present invention provides a stack package having an excellent heat dissipation characteristic while maintaining a slim configuration, thus increasing the value of the end product. It is therefore possible to realize an electronic appliance having superior thermal properties.

Hereafter, various embodiments of the present invention will be described with reference to the attached figures.

Figure 1:
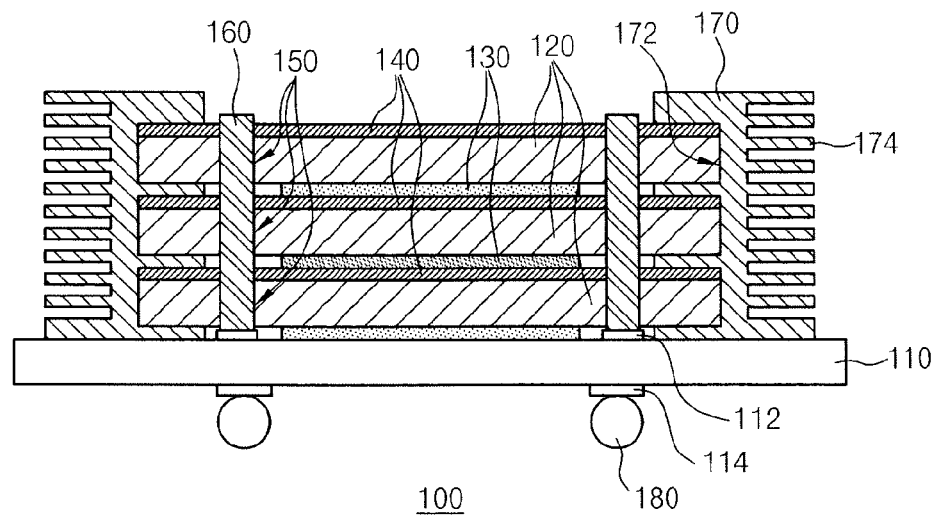
FIG. 1 is a cross-sectional view of a stack package in accordance with an embodiment of the present invention.
Figure 2:
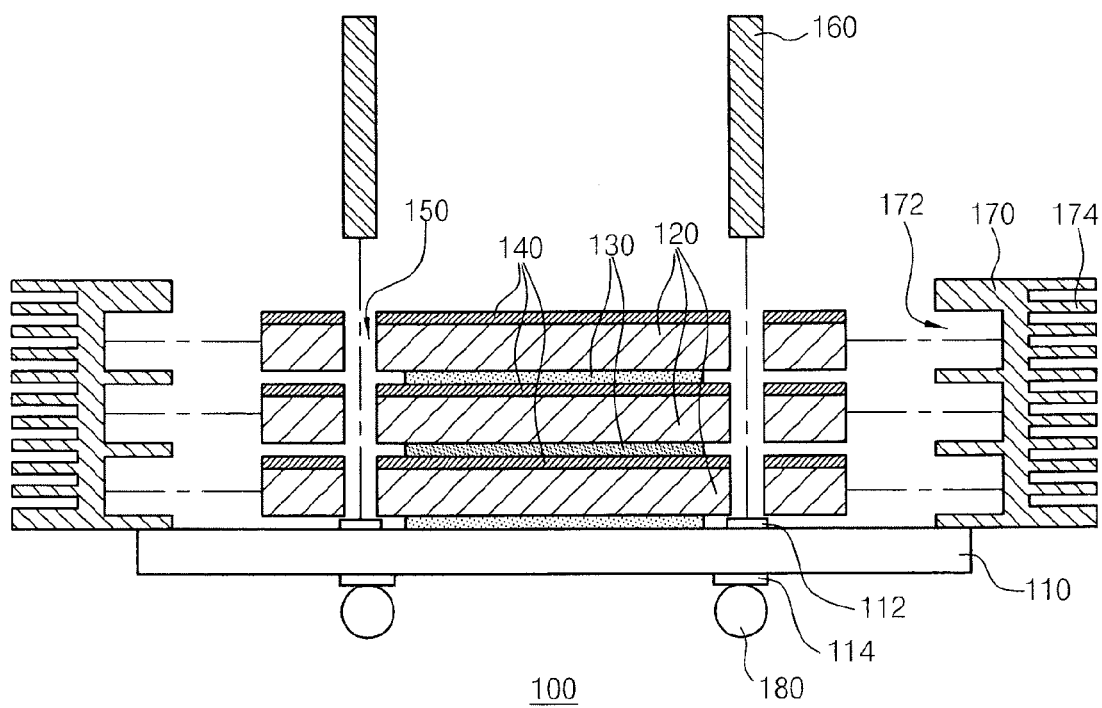
FIG. 2 is an expanded cross-sectional view of the stack package in accordance with the embodiment of the present invention.

FIG. 1 is a cross-sectional view of a stack package in accordance with an embodiment of the present invention, and FIG. 2 is an expanded cross-sectional view of the stack package in accordance with the same embodiment of the present invention.

Referring to FIGS. 1 and 2, a stack package 100 according to an embodiment of the present invention includes a base substrate 110, at least two semiconductor chips 120 stacked on the base substrate 110, electrical connection members 160 for electrically connecting the stacked semiconductor chips 120 and the base substrate 110 to each other, a pair of heat sinks 170 installed such that they are in contact with both side surfaces of the stacked semiconductor chips 120, and outside connection terminals 180 attached to the lower surface of the base substrate 110.

The base substrate 110 has a plurality of connection pads 112 on the upper surface thereof and a plurality of ball lands 114 on the lower surface thereof. The base substrate 110 has therein a circuit pattern (not shown) that connects the connection pads 112 and the ball lands 114 to each other. The connection pads 112 are adjacent to both edges on the upper surface of the base substrate 110.

At least two, for example as illustrated in FIGS. 1 and 2, three semiconductor chips 120 are stacked on the upper surface of the base substrate 110 with spacers 130 interposed between two adjoining semiconductor chips 120. The stacked semiconductor chips 120 are defined with through-holes 150 for electrical connections that are adjacent to both edges thereof and correspond to the connection pads 112 of the base substrate 110. Here, in the stacked semiconductor chips 120 according to an embodiment of the present invention, pad rerouting is implemented on the upper surfaces of the semiconductor chips 120 such that wirings (not shown) are formed on the surfaces of the through-holes 150 or around the through-holes 150.

The spacer 130 has a size that is less than that of the semiconductor chip 120. Preferably, each spacer 130 is sized such that the spacer 130 can be placed between two oppositely facing through-holes 150. A heat conductive layer 140 is deposited on the lower surface of each stacked semiconductor chip 120, opposite of the upper surface formed with bonding pads (not shown), in order to protect the semiconductor chip 120 and quickly transfer the heat inevitably generated by the operation of the semiconductor chip 120 to the heat sinks 170. The heat conductive layer 140 is formed by depositing polymeric resin, which is characterized by excellent heat conductivity, to a predetermined thickness.

The electrical connection members 160 are comprised of copper pins. The electrical connection members 160 are respectively inserted into the through-holes 150 of the stacked semiconductor chips 120 and connect to the connection pads 112 of the base substrate 110. According to this, the electrical connection members 160 are electrically connected to the stacked semiconductor chips 120 and the connection pads 112 of the base substrate 110, thereby electrically connecting the stacked semiconductor chips 120 and the base substrate 110 to each other.

A heat sink 170 is installed on both sides of the stacked semiconductor chips 120 such that they are come into contact with both side surfaces of the stacked semiconductor chips 120 and extend in a direction perpendicular to the base substrate 110. At this time, each heat sink 170 has a plurality of insertion grooves 172 on the surface coming into contact with the stacked semiconductor chips. The side surfaces of the stacked semiconductor chips 120, including the heat conductive layers 140, are respectively inserted into the insertion grooves 172. Also, each heat sink 170 has a plurality of branches 174, located on the surface opposite of the stacked semiconductor chips 120, for improving the heat dissipation capacity of the heat sink 170. The insertion grooves 172 have a depth that allows the heat sink 170 to maximally approach the electrical connection members 160 without coming into contact therewith while connecting with the side surfaces of the stacked semiconductor chips 120, including the heat conductive layers 140. Therefore, as the stacked semiconductor chips 120, including the heat conductive layers 140, are inserted into the insertion grooves 172 of the heat sinks 170, the heat sinks 170 come into contact with the semiconductor chips 120, including the heat conductive layers 140. Since the heat sinks 170 are come into contact with all of the semiconductor chips 120, the heat generated in the semiconductor chips 120 is equally discharged.

The outside connection terminals 180 serve as mounting areas to external circuits and are preferably comprised of solder balls. The outside connection terminals 180 are respectively attached to the ball lands 114 located on the lower surface of the base substrate 110.

In the stack package according to an embodiment of the present invention as described above, the heat sinks extend in a direction perpendicular to the base substrate while coming into contact with the side surfaces of the stacked semiconductor chips. Accordingly, the installation of heat sinks does not lead to an increase in the overall thickness of the stack package. In particular, the positioning of the heat sinks such that they come into contact with the stacked semiconductor chips allows for the equal discharge of the generated heat through the heat sinks.

Hence, the present invention maintains a slim configuration of a stack package and improves the thermal characteristic of the stack packagethereby allowing for a compact and multi-functional electronic appliance with superior thermal properties.

Figure 3:
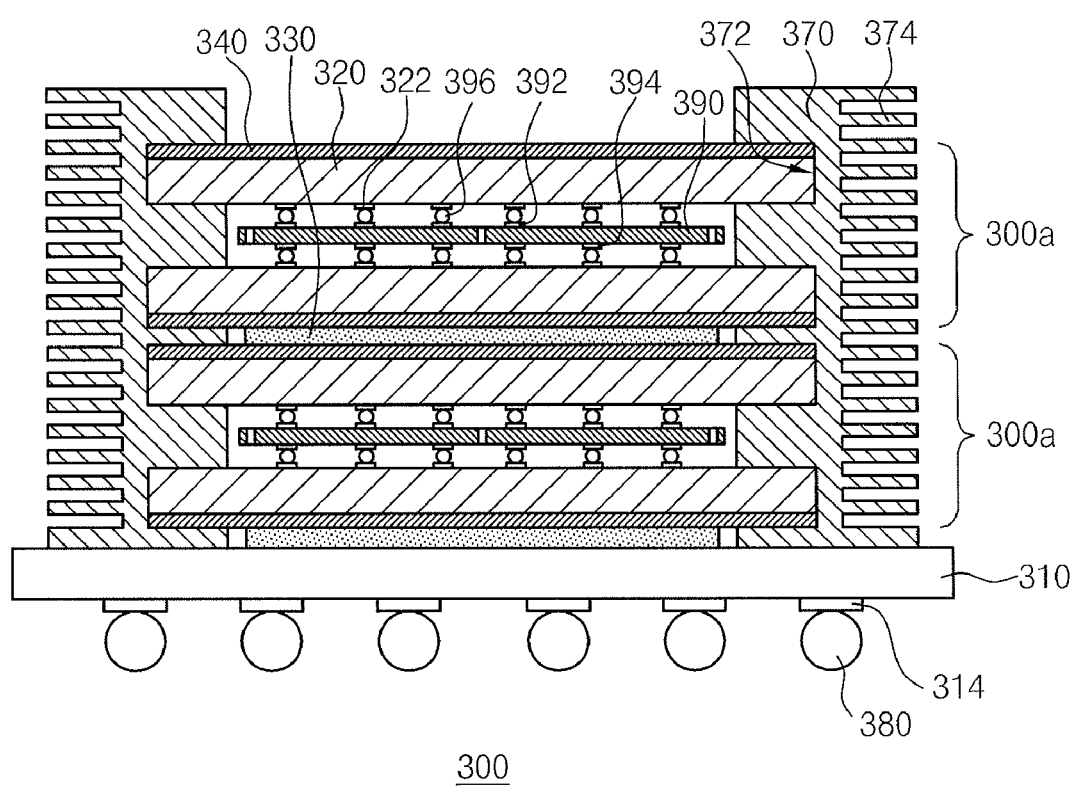
FIG. 3 is a cross-sectional view of a stack package in accordance with another embodiment of the present invention.

FIG. 3 is a cross-sectional view illustrating a stack package in accordance with another embodiment of the present invention. Referring to FIG. 3, the stack package 300 according to this embodiment of the present invention includes a base substrate 310, at least two stack package units 300a stacked on the base substrate 310, a pair of heat sinks 370 installed such that they come into contact with both sides surfaces of the stacked package units 300a, and outside connection terminals 380 attached to the lower surface of the base substrate 310.

The stack package unit 300a includes a pattern tape 390, and semiconductor chips 320 flip-chip bonded to the upper and lower surfaces of the pattern tape 390 by bumps 396. The semiconductor chip 320 has bonding pads 322 on the upper surface thereof, and a heat conductive layer 340, made of polymeric resin characterized by excellent heat conductivity, is deposited on the lower surface thereof. The pattern tape 390 has first and second bump lands 392 and 394 on the upper and lower surfaces thereof. Further, the pattern tape 390 has therein a circuit pattern (not shown) for electrically connecting the first and second bump lands 392 and 394 with each other. The bumps 396 electrically and physically connect the bonding pads 322 of the semiconductor chips 320 to the first and second bump lands 392 and 394 of the pattern tape 390.

The heat sinks 370 are installed such that they contact both side surfaces of the stacked semiconductor package units 300a. The heat sinks 370 are installed such that they extend in a direction perpendicular to the base substrate 310 and come into contact with all of the semiconductor chips 320 of the stack package units 300a. Similar to the above-described embodiment, each heat sink 370 has a plurality of insertion grooves 372, located on the side thereof contacting the semiconductor chips 320, into which the sides surfaces of the semiconductor chips 320, including the heat conductive layers 340, are respectively inserted. Also, each heat sink 370 has a plurality of branches 374, located on the surface opposite of the semiconductor chips 320, for improving the heat dissipation capacity of the heat sink 370.

Meanwhile, although not illustrated in FIG. 3, the pattern tape 390 has bond fingers (not shown) that are connected to the first and second bump lands 392 and 394. The bond fingers are electrically connected to the connection pads (not shown) of the base substrate 310 through metal wires (not shown).

The outside connection terminals 380 are preferably comprised of solder balls and are attached to the ball lands 314 formed on the lower surface of the base substrate 310.

In an embodiment of the present invention as described above, it is not necessary to define through-holes for electrical connections in the semiconductor chips 320 of the respective stack package units 300a, thereby eliminating the need for rerouting of the pads. Moreover, since the pattern tapes and the metal wires serve as electrical connections between the semiconductor chips and the base substrate, members such as copper pins are not needed.

Likewise, in the stack package in accordance with an embodiment of the present invention as described above, because the heat sinks extend in a direction perpendicular to the base substrate while nonetheless maintaining contact with the side surfaces of the stacked semiconductor chips, installation of the heat sinks does not increase the thickness of the stack package. It is therefore possible to equally discharge heat from the respective semiconductor chips.

Hence, the present invention ensures the slim configuration of the stack package while improving the thermal characteristic of the stack package, thereby realizing an electronic appliance with superior thermal properties.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stack package comprising:
    a base substrate having connection pads on an upper surface thereof and ball lands on a lower surface thereof;
    at least two semiconductor chips stacked by intervening a spacer on the base substrate and defined with through-holes for electrical connections on positions corresponding to the connection pads;
    electrical connection members for electrically connecting the stacked semiconductor chips and the base substrate to each other;
    a pair of heat sinks formed such that they contact the side surfaces of the stacked semiconductor chips and extend in a direction perpendicular to the base substrate; and
    outside connection terminals attached to the ball lands on the lower surface of the base substrate.

2. The stack package according to claim 1, wherein the connection pads are adjacent to both edges of the upper surface of the base substrate.

3. The stack package according to claim 1, wherein the spacer is smaller than the semiconductor chip.

4. The stack package according to claim 1, further comprising:
    heat conductive layers covering the surfaces of the semiconductor chips to be come into contact with the heat sinks.

5. The stack package according to claim 4, wherein the heat conductive layer is deposited on the lower surface of each semiconductor chip.

6. The stack package according to claim 1, wherein pad rerouting is implemented on the upper surface of each semiconductor chip such that wiring is formed on a surface of the through-hole or around the through-hole.

7. The stack package according to claim 1, wherein the electrical connection members are comprised of copper pins.

8. The stack package according to claim 7, wherein the copper pins are inserted into the through-holes of the stacked semiconductor chips and contact the connection pads of the base substrate.

9. The stack package according to claim 8, wherein the copper pins are respectively inserted into the through-holes of the stacked semiconductor chips, are electrically connected to the stacked semiconductor chips and the connection pads of the base substrate, and electrically connecting the stacked semiconductor chips and the base substrate to each other.

10. The stack package according to claim 1, wherein each heat sink is defined, on the side surface thereof contacting the stacked semiconductor chips, with insertion grooves into which the semiconductor chips are respectively inserted.

11. The stack package according to claim 10, wherein each heat sink is formed, on the the side surface thereof oppositely facing the one side surface, with a plurality of branches.

12. The stack package according to claim 1, wherein the outside connection terminals are comprised of solder balls.

* * * * *